United States Patent [19]

Hirose

[11] Patent Number: 4,914,660
[45] Date of Patent: Apr. 3, 1990

[54] METHOD AND APPARATUS FOR DECODING ERROR CORRECTING CODE

[75] Inventor: Shintaro Hirose, Gifu, Japan
[73] Assignee: Sanyo Electric Co., Ltd., Osaka, Japan
[21] Appl. No.: 179,420
[22] Filed: Apr. 8, 1988
[51] Int. Cl.$^4$ .............................................. H04L 1/00
[52] U.S. Cl. ................................... 371/37.1; 371/37.8
[58] Field of Search ................... 371/37, 38, 37.1, 37.8

[56] References Cited

U.S. PATENT DOCUMENTS 3,786,439  1/1974  McDonald et al. ................... 371/38
3,811,108  5/1974  Howell ................................. 371/37

FOREIGN PATENT DOCUMENTS 288524  12/1986  Japan ................................... 371/43

OTHER PUBLICATIONS

Lin, S. et al., Error Control Coding, Prentice-Hall, pub. 1983, pp. 103-110.

Primary Examiner—Jerry Smith
Assistant Examiner—Stephen M. Baker
Attorney, Agent, or Firm—Darby & Darby

[57] ABSTRACT

A received signal train V(X) having a code length of 19 bits, in which an error correcting code is added on the basis of a generator polynominal G(X) of degree 11, is converted into a signal train $V_I(X)$ obtained by reversing an arrangement order from MSB to LSB in V(X) so that LSB in V(X) is positinoed in MSB in $V_I(X)$, . . . , and MSB in V(X) is positioned in LSB in $V_I(X)$ and then, the signal train $V_I(X)$ is divided by an inverse generator polynominal $G_I(X)$ of the generator polynominal G(X). A judgement is made on the number of "1"s in the resulting 11-bit syndrome $S_I(X)$. If the number is one or zero, single-bit error correction is performed by MOD2 addition of the received signal train V(X) and the syndrome $S_I(X)$. On the other hand, remaining 6 bits in occurrence of a primary error are read out from a ROM 13 with the address of particular 5 bits in the syndrome $S_I(X)$. A judgement is made on coincidence of the 6 bits read out and corresponding 6 bits in the actually calculated syndrome $S_I(X)$. As a result, a judgement is made that the received signal train V(X) includes a secondary error or an error of higher degree if non-coincidence is indicated and if it is determined that the number of "1"s in the syndrome $S_I(X)$ is two or more.

13 Claims, 4 Drawing Sheets

| INDEX $l_1$ | SYNDROME $S_1(X)$ MSB                LSB |
|---|---|
| 0  | 0 0 0 0 0 0 0 0 0 0 1 |
| 1  | 0 0 0 0 0 0 0 0 0 1 0 |
| 2  | 0 0 0 0 0 0 0 0 1 0 0 |
| 3  | 0 0 0 0 0 0 0 1 0 0 0 |
| 4  | 0 0 0 0 0 0 1 0 0 0 0 |
| 5  | 0 0 0 0 0 1 0 0 0 0 0 |
| 6  | 0 0 0 0 1 0 0 0 0 0 0 |
| 7  | 0 0 0 1 0 0 0 0 0 0 0 |
| 8  | 0 0 1 0 0 0 0 0 0 0 0 |
| 9  | 0 1 0 0 0 0 0 0 0 0 0 |
| 10 | 1 0 0 0 0 0 0 0 0 0 0 |
| 11 | 1 0 0 0 1 1 1 0 1 0 1 |
| 12 | 1 0 0 1 0 0 1 1 1 1 1 |
| 13 | 1 0 1 0 1 0 0 1 0 1 1 |
| 14 | 1 1 0 1 1 1 0 0 0 1 1 |
| 15 | 0 0 1 1 0 1 1 0 0 1 1 |
| 16 | 0 1 1 0 1 1 0 0 1 1 0 |
| 17 | 1 1 0 1 1 0 0 1 1 0 0 |
| 18 | 0 0 1 1 1 1 0 1 1 0 1 |

METHOD AND APPARATUS FOR DECODING ERROR CORRECTING CODE

BACKGROUND OF THE INVENTION

1. Field of the Invention

The present invention relates to a method and an apparatus for decoding an error correcting code, and more specifically, it relates to a method and an apparatus for decoding an error correcting code such as a BCH (Bose-Chaudhuri-Hocquenghem) code employed for detecting and correcting a bit error in received data in a digital data transmission system such an automobile telephone system, a cordless telephone or satellite broadcasting.

2. Description of the Prior Art

In transmission of digital data, a bit error is generally caused by deterioration in the S-N ratio or distortion of the transmission system. In a general method of coping with such a bit error, redundant bits having error correcting ability (hereinafter referred to as error correcting bits) are previously added to original information bits, to be subjected to transmission. On the data sink side, a bit error position is detected on the basis of the received error correcting bits, to be corrected. Among such error correcting codes, the BCH code, having high error correcting ability with respect to length (bit number) of the correcting bits, is widely employed for transmission of a control signal in an automobile telephone system or a cordless telephone in Japan or U.S., or in a digital data transmission system such as PCM (pulse Code Modulation) audio broadcasting by satellite.

Description is briefly made on detection/correction of a bit error in transmission data through the BCH code. On the data source side, error correcting bits are obtained on the basis of original information bits and a predetermined generator polynominal $G(X)$ to be added to the original information bits, and subjected to transmission. On the data sink side, a received signal train $V(X)$ is divided by the above described generator polynominal, thereby to find the remainder term $S(X)$ thereof. This remainder term $S[X]$ is hereinafter referred to as a syndrome. Presence/absence of a bit error is judged on the basis of the syndrome $S(X)$, to detect the error position. Then, bit error correction is performed by inverting the value of the bit corresponding to the detected error position.

Figure 1:
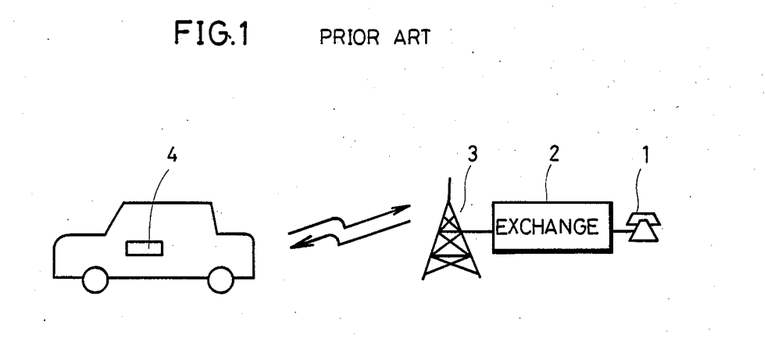
FIG. 1 is a typical diagram showing basic structure for data transmission in an automobile telephone system employing a BCH code.

FIG. 1 typically illustrates basic structure for data transmission in an automobile telephone system employing such a BCH code. Referring to FIG. 1, each terminal 1 is connected to a base station 3 through an exchange 2. High frequency radio communication in a scope of 800 to 900 MHz is performed between the base station 3 and a mobile station 4, while, in particular, control between both the stations such as origination, paging and channel switching is performed by transmission of digital signals.

For example, in an automobile telephone system according to the specification of Nippon Telegraph and Telephone Corp., original information bits are transmitted with addition of the BCH code in transmission of digital signals for such control. More specifically, according to the specification of Nippon Telegraph and Telephone Corp., a first control signal from the base station 3 to the mobile station 4 and a second control signal from the mobile station 4 to the base station 3 both employ the BCH code obtained on the basis of the original information bits and a generator polynominal $G(X) = X^{11} + X^9 + X^7 + X^6 + X^5 + X + 1$. On the data source side, a bit train of zeros in number equal to the degree of the generator polynominal [i.e., 11] is added to the original information bits so as to follow the least significant bit thereof. Then, the original information bits with the bit train of zeros are divided by the generator polynominal $G(X)$, to find the remainder $R(X)$. This remainder $R(X)$ is added to the original information bits so as to follow the least significant bit thereof, to be subjected to transmission.

According to the above described specification of Nippon Telegraph and Telephone Corp., for example, the code length n of the digital control signal thus transmitted is 19 bits, the length m of the information bits therein is 8 bits while minimum distance of codes is 7. Thus, it is possible to provide three-bit error correcting ability, while erroneous correction may be caused in this case. Therefore, the specification of Nippon Telegraph and Telephone Corp. is restricted only to single-bit error correcting ability (primary correction), to improve ability for preventing erroneous correction.

In order to perform primary correction of the received data to which the BCH code is added, the received signal train $V[X]$ is generally divided by the generator polynominal $G(X)$ to first obtain the remainder term, i.e., the syndrome $S(X)$. If the value of the syndrome $S(X)$ is zero, i.e., when the received signal train $V(X)$ is exactly divisible by the generator polynominal $G(X)$, a judgement is made that no bit error is caused. On the other hand, if the value of the syndrome $S(X)$ is not zero, i.e., when the received signal train $V(X)$ is not divided out by the generator polynominal $G(X)$, a judgement is made that a single-bit error or a multiple-bit error is caused in the process of data transmission. A ROM table storing previously calculated values of bit error positions corresponding to syndrome values in occurrence of single-bit errors is prepared such that the corresponding bit error position can be obtained from the ROM table with the address of the obtained value of the syndrome $S(X)$. Such a technique is disclosed in, for example, an article by K. Koga et al., entitled "Bit Error Rate Reduction Performance of BCH Codes and Self-Orthogonal Convolutional Codes", Transactions of IECE Japan, February 1979, Vol. J62-B, No. 2.

According to the above described method, however, capacity required for the ROM is $2^k$ bytes assuming that k represents the degree of the generator polynominal (in the case of the code length of within 255 bits. If the code length exceeds 255 bits, the capacity is further increased). In the above described specification of Nippon Telegraph and Telephone Corp., the degree of the generator polynominal is 11, and hence $2^{11} = 2048$ bytes are required as the capacity for the ROM. On the other hand, the code length of the received signal is 19 bits, and hence the number of effective error positions in occurrence of a primary error is 19.

Thus, according to the conventional error correcting method as described above, the required ROM capacity is too far increased as compared with the number of the primary error correcting positions, to deteriorate availability of the ROM.

On the other hand, if and when the generator polynominal $G(X)$ can be factored as $G(X) = G_1(X) \cdot G_2(X)$, a primary error can be judged by the following method. Syndromes $S_1(X)$ and $S_2(X)$ for primitive polynominals $\dot{G}_1(X)$ and $G_2(X)$ found by factoring the generator polynominal $G(X)$ are first obtained. A single-bit error position $l$ in a received signal train $V(X)$ is read out from a first ROM table with the address of the syndrome $S_1(X)$. Then, a syndrome $S_2'(X)$ corresponding to the single-bit error position $l$ is read out from a second ROM table to be compared with the syndrome $S_2(X)$ actually calculated from an operation of $V(X)/G_2(X)$ The primary error is judged on the basis of the comparison. According to this method, capacity for the ROM can be significantly reduced. Such a system for decoding a BCH code is disclosed in Japanese Patent Laying-Open Gazette No. 288524/1986.

However, in the case of a generator polynominal which cannot be factored, such as a generator polynominal $G(X) = X^{11} + X^9 + X^7 + X^6 + X^5 + X + 1$ employed in an automobile telephone system according to the above described specification of Nippon Telegraph and Telephone Corp., the above described method cannot be employed, so that capacity for the ROM cannot be reduced.

SUMMARY OF THE INVENTION

Therefore, a primary object of the present invention is to provide a method and an apparatus for decoding an error correcting code, which can reduce storage capacity required for error correction of a received signal train for improving memory availability.

Briefly stated, according to the present invention, a signal train $V_f(X) = V(1/X) \cdot X^{(l+m)-1}$ is produced by reversing an arrangement order from the most significant bit (MSB) to the least significant bit (LSB) in an (l+m)-bit received signal train $V(X)$ so that LSB in $V(X)$ is positioned in MSB in $V_f(X)$, ..., and MSB in $V(X)$ is positioned in LSB in $V_f(X)$, the received signal train $V(X)$ including an l-bit error correcting code calculated on the basis of a generator polynominal $G(X)$ of degree l (l :positive integer) added to information bits of m (m: positive integer equal to l or less than l) bits. The signal train $V_f(X)$ is divided by an inverse polynominal $G_f(X) = G(1/X) \cdot X^l$ of the generator polynominal $G(X)$, to obtain a syndrome $S_f(X)$ of l bits. The number of "1"s in the obtained l-bit syndrome $S_f(X)$ is detected. If the number is one or zero, a signal train obtained by performing an exclusive OR operation with the l-bit syndrome $S_f(X)$ with respect to l bits of most significant bits in the received signal train $V(X)$ is selected. If it is determined that the number is two or more, the signal train $V(X)$ is directly selected. In addition, on the basis of first data of arbitrary x (x:positive integer) bits in the obtained l-bit syndrome $S_f(X)$, second data of remaining $y = (1-x)$ bits corresponding to the first data of x bits, in a previously calculated syndrome $S_f(X)$ in occurrence of a single-bit error of the signal train $V(X)$ is extracted. A judgement is made whether or not the second data coincides with third data of $y = (1-x)$ bits other than the first data of x bits, in the actually obtained l-bit syndrome $S_f(X)$. When it is determined that the number of "1"s in the l-bit syndrome $S_f(X)$ is two or more and the second data is not in coincidence with the third data, a judgement is made that the received signal train $V(X)$ includes a double-bit or multiple-bit error.

In accordance with another aspect of the present invention, a judgement is made that the received signal train $V(X)$ includes no error or a single-bit error at least when it is determined that the second data coincides with the third data.

Therefore, a principal advantage of the present invention is that since a signal train $V_f(X)$ obtained by reversing an arrangement order from MSB to LSB in a received signal train $V(X)$ so that the LSB in $V(X)$ is positioned in MSB in $V_f(X)$, ..., and MSB in $V(X)$ is positioned in LSB in $V_f(X)$ is divided by an inverse polynominal $G_f(X)$ of a generator polynominal $G(X)$ and a judgement is made on the number of "1"s in an l-bit syndrome $S_f(X)$, being the remainder term, to perform single-bit error correction, and a judgement is made on coincidence of previously calculated second data of remaining $y = (1-x)$ bits with the address of first data of arbitrary x bits in the syndrome $S_f(X)$ and actually calculated third data of remaining $y = (1-x)$ bits, to judge whether or not a double-bit or multiple-bit error is caused, the required storage capacity can be significantly reduced, as compared with the conventional error correcting system.

These objects and other objects, features, aspects and advantages of the present invention will become more apparent from the following detailed description of the present invention when taken in conjunction with the accompanying drawings.

DESCRIPTION OF THE PREFERRED EMBODIMENT

Description is now made on the principle of the present invention. It is assumed that $G_f(X)$ represents an inverse polynominal of a generator polynominal $G(X)$ and $V_f(X)$ represents a signal train obtained by reversing an arrangement order from MSB to LSB in a received signal train $V(X)$ so that LSB in $V(X)$ is positioned in MSB in $V_f(X)$, ..., and MSB in $V(X)$ is positioned in LSB in $V_f(X)$. The following description is made on the case in which the above described generator polynominal $G(X) = X^{11} + X^9 + X^7 + X^6 + X^5 + X + 1$ is employed as a generator polynominal. In this case, the inverse polynominal $G_f(X)$ of the generator polynominal $G(X)$ is expressed as $G_f(X) = G(1/X) \cdot X^{11} = X^{11} + X^{10} + X^6 + X^5 + X^4 + X^2 + 1$, and the signal train $V_f(X)$ obtained by reversing an arrangement order from MSB to LSB in the received signal train $V(X)$ is expressed as $V_f(X) = V(1/X) \cdot X^{n-1}$ (n =code length).

Figure 2:
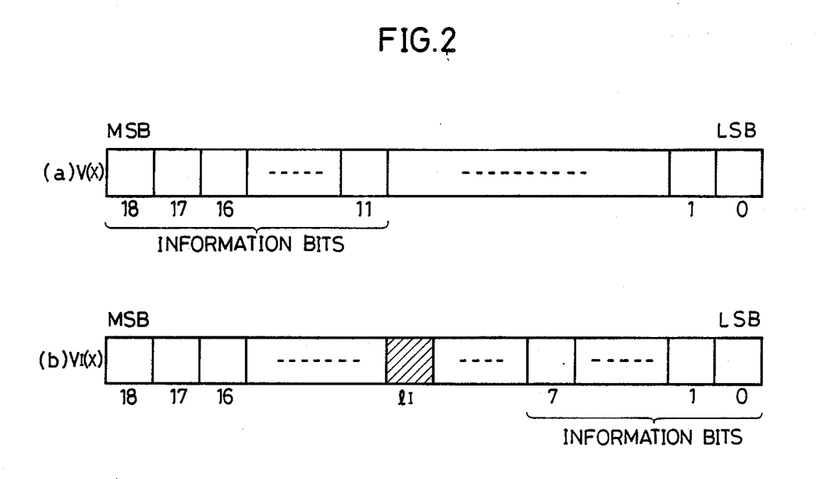
FIG. 2(a) is a typical diagram showing a received signal train $V(X)$ of 19 bits.
FIG. 2(b) is a typical diagram showing a signal train $V_f(X)$ of 19 bits.

FIG. 2(a) is a typical diagram showing the received signal train $V(X)$, and FIG. 2(b) is a typical diagram the above described signal train $V_f(X)$. In the following description, it is assumed that the code length n of the received signal train $V(X)$ is 19 bits as shown in FIG. 2(a) and information bits are 8 bits of most significant bits thereof. In this case, information bits in the signal train $V_I(X)$ are 8 bits of least significant bits as shown in FIG. 2(b). Furthermore, in FIG. 2(b), a primary error bit position (hereinafter referred to as an index) in the signal train $V_I(X)$ is represented by $l_I$.

Figure 3:
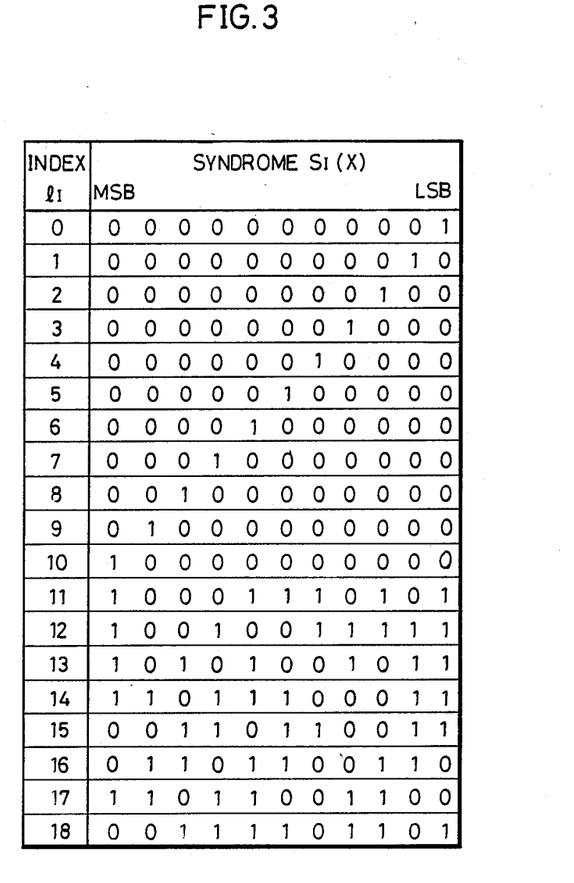
FIG. 3 is a table showing relation between single-bit error positions $l_1$ in a signal train $V_f(X)$ and values of a syndrome $S_f(X)$.

FIG. 3 is a table showing relation between the values of the remainder term resulting from division of the above described signal train $V_I(X)$ by the inverse generator polynominal $G_I(X)$, i.e., the syndrome $S_I(X)$ and the values of the above described index $l_I$. The index $l_I$ is represented in decimal notation and the syndrome $S_I(X)$ is 0 to 7 correspond to information bits and $l_I = 8$ to 18 correspond to error correcting bits. The present invention basically notes the fact that when a bit error is not caused at the time of transmission, i.e., when the remainder term resulting from division of the original received signal train $V(X)$ by the original generator polynominal $G(X)$ is zero, the remainder term resulting from division of the signal train $V_I(X)$ by the inverse polynominal $G_I(X)$ is also zero.

More specifically, in general, when a signal train of n bits, including a single-bit error, is divided by a generator polynominal of degree l to calculate a syndrome, a pattern of the obtained syndrome is such that the number of "1"s in each corresponding syndrome is one when the are 0 to $l-1$ while being two or more when the indices are l to $n-1$.

The received signal train generally has information bits of 8 bits of the most significant bits as shown in FIG. 2(a). Thus, when the information bits of the most significant bits in the received signal train $V(X)$ includes a single-bit error, a bit pattern of the syndrome resulting from division of this received signal train $V(X)$ by the generator polynominal $G(X)$ is such that the number of "1"s is two or more as in the case of the indices 11 to 18 shown in FIG. 3. Thus, in order to correct the single-bit error which is caused in such information bits, an error position must be first detected on the basis of a pattern of each syndrome and then, data in the error position must be inverted, by the method described as the prior art.

On the other hand, according to the present invention, if and when the length m of the information bits is less than the length m of correcting bits (the degree of a generator polynominal) l, the signal train $V_I(X)$, obtained by reversing an arrangement order from MSB to LSB in the received signal train $V(X)$ so that LSB in $V(X)$, is positioned in MSB in $V_I(X)$, ..., and MSB in $V(X)$ is positioned in LSB in $V_I(X)$ is divided by the inverse generator polynominal $G_I(X)$. More specifically, the signal train $V_I(X)$ has information bits of 8 bits of least significant bits as shown in FIG. 2(b), a pattern of the syndrome obtained when a single-bit error occurs in information bits of least significant bits in the signal train $V_I(X)$ is such that the number of "1"s is one as in the case of the indices 0 to 7 shown in FIG. 3. More specifically, if the length m of information bits is less than the length l of correcting bits, a single-bit error position in the information bits can correspond to the position of "1" in the corresponding syndrome. Thus, the value of the syndrome is added to the received signal train by MOD2(EX-OR) addition, so that the information bits can be easily corrected.

Description is now made on the principle of the present invention in more concrete terms in accordance with the embodiment.

In each syndrome $S_I(X)$ shown in FIG. 3, when the number of "1"s in 11 bits is one, a judgment can be made that a primary error occurs in any of indices $l_I=0$ to 10 corresponding to 11 bits of most significant bits in the received signal train $V(X)$, i.e., 11 bits of least significant bits in the signal train $V_I(X)$, including information bits and error correcting bits. If the number of "1"s is zero, a judgment of no error is made.

It is assumed that the number of "1"s in the syndrome $S_I(X)$ is one, i.e., a primary error occurs in any of indices $l_I = 0$ to 10, as described above. In this case, when 11 bits of most significant bits in the received signal train $V(X)$ including information bits of 8 bits and error correcting codes of 3 bits and a corresponding syndrome $S_I(X)$ of 11 bits are added by MOD2 (EX-OR), the added value is a value obtained by performing primary error correction of 11 bits of most significant bits in the received signal train $V(X)$.

For example, it is assumed that an error occurs in the second bit from MSB, of information bits in the received signal train $V(X)$. In this case, a value corresponding to the index $l_I = 1$ in FIG. 3 is obtained as the syndrome $S_I(X)$. When the 11-bit syndrome $S_I(X)$ and 11 bits of most significant bits in the received signal train $V(X)$ are added by MOD2 while LSB in the 11-bit syndrome $S_I(X)$ corresponds to MSB in 11 bits of most significant bits in the received signal train of $V(X)$, the value of the second erroneous bit from MSB, of the information bits in the received signal train $V(X)$ is inverted and corrected because the second bit from LSB in the syndrome $S_I(X)$ is "1".

Thus, if and when the number of "1"s in the 11-bit syndrome $S_I(X)$ is one or zero, a primary error is corrected by the above described MOD2 addition. On the other hand, if the number of "1"s in the syndrome $S_I(X)$ is two or more, a primary error cannot be corrected even if the syndrome $S_I(X)$ including "1"s the number of which is two or more, is added to the received signal train $V(X)$ by MOD2, as obvious from the table in FIG. 3. Then, when a judgement is made that the number of "1"s is two or more, the above described correction is not performed, to directly select the received signal train $V(X)$. A judgement is further made on presence/absence of a primary error in the received signal train $V(X)$.

More specifically, assuming the values of arbitrary bits, for example, values of 5 bits in total comprising 3 bits of most significant bits and the sixth and seventh bits from the most significant bit in each syndrome $S_I(X)$, the indices $l_I$ and the above described 5 bits are in one-to-one correspondence to each other except for the values of the syndrome corresponding to the indices $l_I = 0$ to 3, 6 and 7.

The values of remaining 6 bits excluding the above described 5 bits in each syndrome $S_I(X)$ in the case of the primary error are previously calculated and a ROM table storing the same is prepared. The values of corresponding remaining 6 bits are read out from the ROM table with the address of the values of the above described 5 bits to make a judgement on coincidence of the values and the values of corresponding six bits in the actually calculated syndrome $S_I(X)$, so that a judgement can be made on presence/absence of a primary error in the received signal train $V(X)$.

In order to reduce capacity for the ROM table, it is not necessary to store data corresponding to the indices $l_I = 0$ to 3, 6 and 7. More specifically, in these cases, data of the above described 5 bits are all "0" and the indices $l_f$ and the above described 5 bits are not one-to-one correspondence to each other. However, such a syndrome is obtained only in the case of the single-bit error. Thus, the number of "1"s in the syndrome is one. Consequently, from the result of counting "1"s in the syndrome, it is possible to judge whether or not an error is a single-bit error. Meanwhile, in selecting arbitrary bits (5 bits in total comprising 3 bits of most significant bits and the sixth and seventh bits from the most significant bit, as described above in the present embodiment), the indices $l_f$ in which the arbitrary bits are all "0" must be degree 1 of the generator polynominal or less. Thus, irrespective of the result of the above described judgment of the number of "1"s in the syndrome and whether or not correction is performed, a judgement can be made on presence/absence of a primary error in the received signal train V(X). In this case, capacity for the ROM can be reduced to $2^5 = 32$ bytes.

Figure 4:
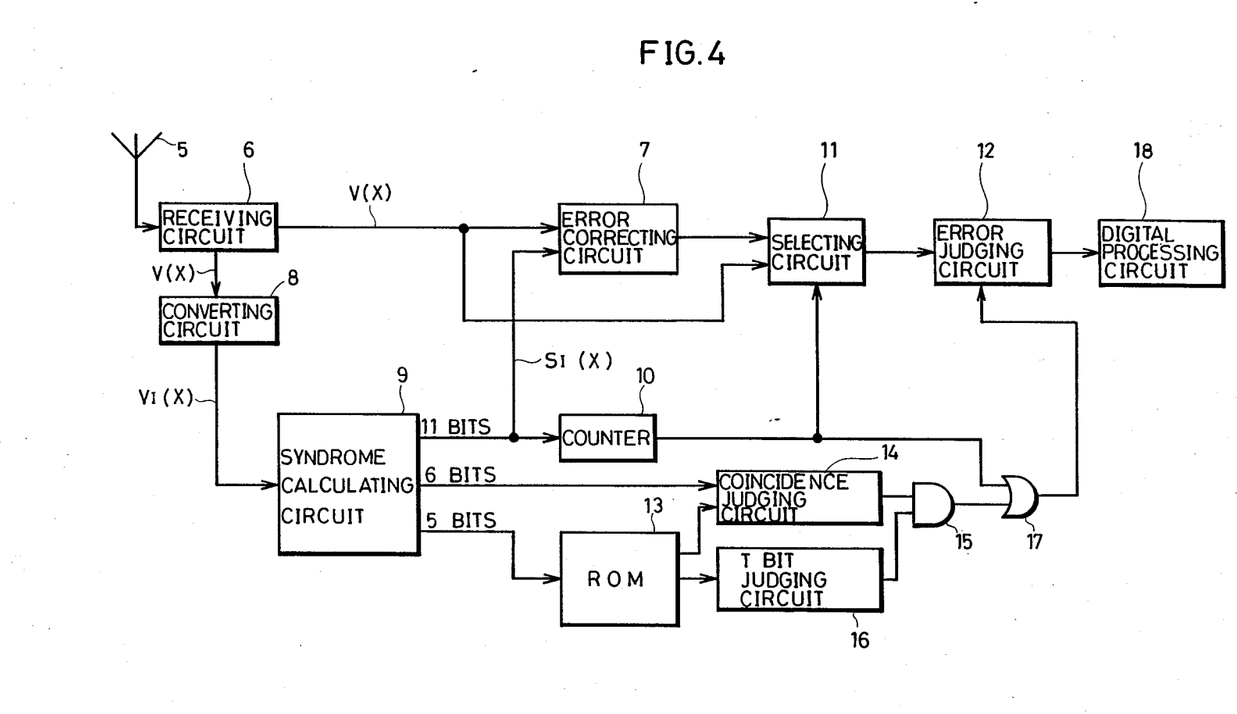
FIG. 4 is a schematic block diagram showing an error correcting code decoding apparatus according to an embodiment of the present invention.

FIG. 4 is a schematic block diagram showing an embodiment of a decoding circuit for carrying out such an error correcting code decoding system according to the present invention. In FIG. 4, transmitted data to which an error correcting code is added in a data source side (not shown) are received by a receiving antenna 5 and a receiving circuit 6. A received signal train V(X) is applied to one input terminal of an error correcting circuit 7 for performing MOD2 addition, i.e., exclusive OR processing, as well as to a converting circuit 8 for reversing an arrangement order from MSB to LSB in the received signal train. More specifically, the converting circuit 8 receives the received signal train V(X) to output a signal train $V_f(X) = V(1/X) \cdot X^{n-1}$ (n:code length) and apply the same to a syndrome calculating circuit 9.

Figure 5:
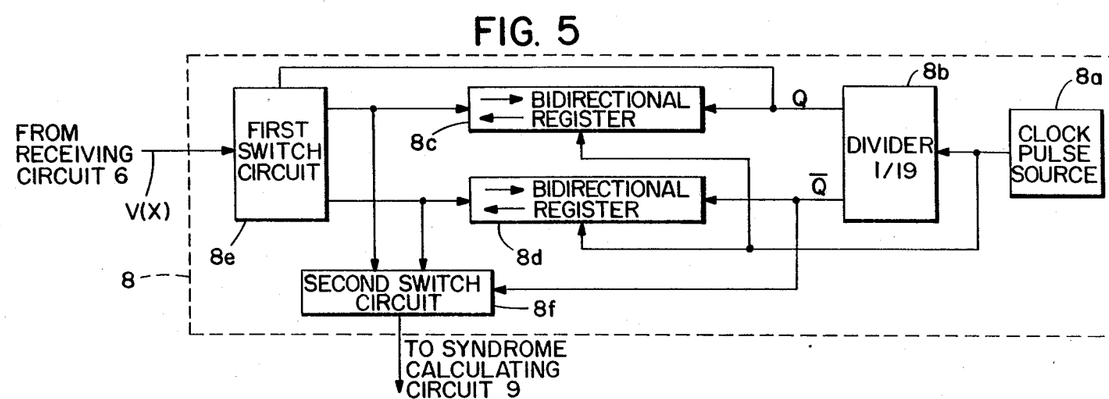
FIG. 5 is a block diagram showing a converting circuit 8 shown in FIG. 4 in detail.

FIG. 5 is a block diagram for explaining the converting circuit 8 shown in FIG. 4 in detail. The converting circuit 8 comprises a clock pulse source 8a, a divider 8b for frequency-dividing into 1/19 a clock pulse supplied from the clock pulse source 8a, a first bidirectional register 8c driven by a first output Q of the divider 8b, a second bidirectional register 8d driven by a second output $\overline{Q}$ of the divider 8b, a first switch circuit 8e responsive to the first output Q of the divider 8b for selectively applying a received signal V(X) from a receiving circuit 6 to the first or second bidirectional register 8c or 8d, and a second switch circuit 8f responsive to the second output $\overline{Q}$ of the divider 8b for selectively outputting an output of the first or second bidirectional register 8c or 8d and applying the same to the syndrome calculating circuit 9. More specifically, the first switch circuit 8e supplies the received signal train V(X) to the first bidirectional register 8c when the first output Q of the divider 8b is at an "H" level while supplying the received signal train V(X) to the second bidirectional register 8d when the first output Q is at an "L" level.

In addition, each of the first and the second bidirectional registers 8c and 8d functions to accept supplied signal train V(X) from MSB when the output of the divider 8b is at the "H" level while reading out the signal train V(X) from LSB when the output is at the "L" level. Furthermore, the second switch circuit 8f selects the output of the first bidirectional register 8c when the second output $\overline{Q}$ of the divider 8b is at the "H" level while selecting the output of the second bidirectional register 8d when the second output $\overline{Q}$ is at the "L" level. More specifically, when the outputs Q and $\overline{Q}$ of the divider 8b are at the "H" and "L" levels, respectively, the signal train V(X) is accepted, from MSB, to the first bidirectional register 8c by the first switch circuit 8e, and the signal train V(X) is read out, from LSB, from the second bidirectional register 8d and selected by the second switch circuit 8f. Then, when the outputs Q and $\overline{Q}$ are at the "L" and "H" levels, respectively, the signal train V(X) is accepted, from MSB to the second bidirectional register 8d by the first switch circuit 8e, and the signal train V(X) is read out, from LSB, from the first bidirectional register 8c and selected by the second switch circuit 8f. By repeating the above described operation, an arrangement order from MSB to LSB in the inputted signal train V(X) is reversed, so that the reversed signal train is outputted from the converting circuit 8 as a signal train $V_f(X)$.

Then, the syndrome calculating circuit 9 divides the signal train $V_f(X)$ supplied from the converting circuit 8 by the inverse generator polynominal $G_f(X) = X^{11} + X^{10} + X^6 + X^5 + X^4 + X^2 + 1$ to calculate a syndrome $S_f(X)$, being the remainder term.

Figure 6:
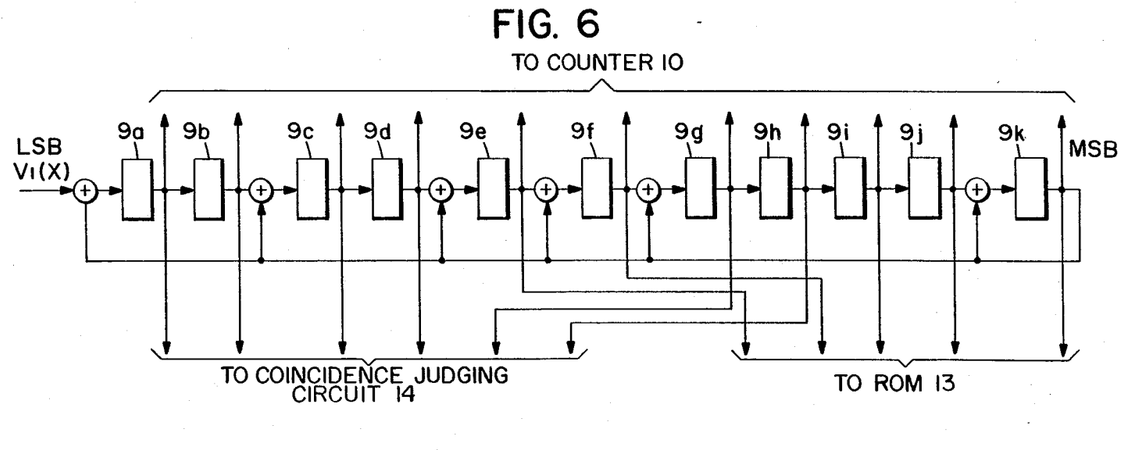
FIG. 6 is a block diagram showing a syndrome calculating circuit 9 shown in FIG. 4 in detail.

FIG. 6 is a circuit diagram for explaining the syndrome calculating circuit 9 in detail. The substance of this circuit 9 is a dividing circuit for dividing the inputted signal train $V_f(X)$ by the inverse generator polynominal $G_f(X) = 1 + X^2 + X^4 + X^5 + X^6 + X^{10} + X^{11}$, which is formed by series-connected shift registers 9a, 9b, 9c, . . . , 9k. Inputting coefficients of the signal train $V_f(X)$ to an input terminal of the circuit 9 bit by bit sequentially from a term of higher degree, contents remaining in the respective shift registers 9a to 9k upon input of the final bit are coefficients of the remainder term to be found, while the content of the rightmost shift register 9k is the coefficient of the term of highest degree of the remainder polynominal $S_f(X)$.

The 11-bit syndrome $S_f(X)$ calculated by the syndrome calculating circuit 9 is applied to another input of the above described error correcting circuit 7, as well as to a counter 10 for counting the number of "1"s in 11 bits. The error correcting circuit 7 performs MOD2 addition, i.e., exclusive OR processing of the received signal train V(X) applied from the receiving circuit 6 and the 11-bit syndrome $S_f(X)$ applied from the syndrome calculating circuit 9 while MSB of the received signal train V(X) corresponds to LSB in the syndrome $S_f(X)$, to apply the result to a selecting circuit 11. On the other hand, the counter 10 generates an output at the "H" level when the number of "1"s in the 11-bit syndrome $S_f(X)$ is one or zero while generating an output at the "L" level when the number is two or more. The selecting circuit 11 selects an output of the error correcting circuit 7 when an output of the counter 10 is at the "H" level and applies the same to an error judging circuit 12 while selecting the received signal train V(X) supplied from the receiving circuit 6 when the output of the counter 10 is at the "L" level and applying the same to the error judging circuit 12.

On the other hand, 5 bits comprising 3 bits of most significant bits and the sixth and seventh bits from the most significant bit as described above, in the 11-bit syndrome $S_f(X)$ calculated by the syndrome calculating circuit 9 are applied to a ROM 13. The values of remaining 6 bits excluding the above described 5 bits, in each syndrome $S_f(X)$ in the case of the primary error are previously stored in the ROM 13. The values of corresponding remaining 6 bits are read out with the address of 5 bits applied from the syndrome calculating circuit 9 and are applied to a coincidence judging circuit 14.

Furthermore, 6 bits other than the above described 5 bits employed for the address, in the 11-bit syndrome $S_f(X)$ actually calculated in the syndrome calculating circuit 9 are applied to the coincidence judging circuit 14. The coincidence judging circuit 14 judges whether or not previously calculated 6 bits read out from the ROM 13 coincide with actually calculated 6 bits applied from the syndrome calculating circuit 9. The coincidence judging circuit 14 generates an output at the "H" level upon coincidence while generating an output at the "L" level upon non-coincidence and applying the same to an AND circuit 15.

On the other hand, an information bit (hereinafter referred to as T bit) of a single bit for judging whether or not 5 bits applied from the syndrome calculating circuit 9 correspond to a predetermined address corresponding to a primary error is further stored in the ROM 13. The state of the T bit is judged by a T bit judging circuit 16. More specifically, the T bit judging circuit 16 generates an output at the "L" level showing that correction cannot be performed when data of the above described 5 bits from the syndrome calculating circuit 9 does not correspond to data of 5 bits which is a predetermined address in the ROM 13 while generating an output at the "H" level showing that correction can be performed when both correspond to each other and applying the same to the AND circuit 15.

Additionally, the above described output of the counter circuit 10 and an output of the AND circuit 15 are applied to an OR circuit 17. An output of the OR circuit 17 is applied to the error judging circuit 12. When the output of the OR circuit 17 is at the "H" level, the error judging circuit 12 makes a judgement that no error is caused as far as information bits in a signal train from the selecting circuit 11 are concerned and applies the signal train to the digital processing circuit 18 of a subsequent stage to be subjected to processing. On the other hand, when the output of the OR circuit 17 is at the "L" level, the error judging circuit 12 makes a judgement that a multiple-bit error may be caused in information bits and applies, for example, an error flag to the digital processing circuit 18 of the subsequent stage. The digital processing circuit 18 does not perform the above described predetermined signal processing in response to the error flag.

Referring now to FIGS. 3 and 4, description is made on operation according to an embodiment of the present invention. The number of "1"s in the 11-bit syndrome $S_f(X)$ calculated by the syndrome calculating circuit 9 is judged by the counter 10. If the number is one, a judgement is made that a primary error occurs in any of indices $l_f = 0$ to 10 corresponding to 11 bits of most significant bits in the received signal train V(X), i.e., 11 bits of least significant bits in the signal train $V_f(X)$. If the number is zero, a judgement is made that no error occurs. If the number of "1"s in the syndrome $S_f(X)$ is one as described above, the value of an erroneous bit can be inverted and corrected by adding 11 bits of most significant bits in the received signal train and the 11-bit syndrome by MOD2 (EX-OR). Thus, when the counter 10 judges that the number of "1"s in the syndrome $S_f(X)$ is one or zero and generates an output at the "H" level, the selecting circuit 11 responsively selects a signal train V(X) obtained by performing single-bit error correction of 11 bits of most significant bits by MOD2 addition in the error correcting circuit 7 and applies the same to the error judging circuit 12. If the number of "1"s in the 11-bit syndrome is zero, the original signal train V(X), including no error, is directly outputted from the error correcting circuit 7.

On the other hand, the output at the "H" level of the counter 10 is also applied to the error judging circuit 12 through the OR circuit 17, which shows availability of the above described primary error correction. As a result, when a judgement of no bit error is made with respect to the information bits in the error judging circuit 12, the signal train V(X) is applied to the digital processing circuit 18 to be subjected to predetermined signal processing.

On the other hand, if the number of "1"s in the syndrome $S_f(X)$ is two or more, the above described single-bit error correction by MOD2 addition cannot be performed, so that the selecting circuit 11 is responsive to the output at the "L" level from the counter 10 for directly selecting the signal train V(X) from the receiving circuit 6 and applying the same to the error judging circuit 12. On the other hand, in the coincidence judging circuit 14, a judgement is made on coincidence of previously calculated remaining 6 bits read out from the ROM 13 with the address of 5 bits outputted from the syndrome calculating circuit 9 and actually calculated remaining 6 bits outputted from the syndrome calculating circuit 9. At the same time, in the T bit judging circuit 16, the state of the T bit is judged. Only if both circuits judge coincidence outputs at the "H" level, the AND circuit generates an output at the "H level. The output at the "H" level is further applied to the error judging circuit 12 through the OR circuit 17. More specifically, in this case, it is shown that a pattern of the syndrome $S_f(X)$ calculated from the signal train $V_f(X)$ coincides with a predetermined pattern of the syndrome $S_f(X)$ in occurrence of a primary error of the received signal train V(X). Thus, a judgment is made in the error judging circuit 12 that no error is included in the information bits in the signal train from the selecting circuit 11. The result of judgement as well as the signal train V(X) is supplied to the digital processing circuit 18 to be subjected to processing.

On the other hand, when the coincidence circuit 14 judges that 6 bits from the syndrome calculating circuit 9 is not in coincidence with 6 bits from the ROM 13 and/or the T bit judging circuit 16 judges that correction cannot be performed, an output of the AND circuit 15 attains the "L" level. On the other hand, the output of the counter 10 is also at the "L" level, so that an output of the OR circuit 17 attains the "L" level. More specifically, in this case, a judgement is made that a secondary error or an error of higher degree is included in the original received signal train V(X) selected by the selecting circuit 11. The result of judgement, as well as the signal train V(X), is supplied to the digital processing circuit 18 to be subjected to processing such as correction or disregarding of the received signal.

As described in the foregoing, according to an embodiment of the present invention, the storage capacity required for error correction can be significantly reduced.

Although in the above described embodiment, it is adapted such that an EX-OR output of the error correcting circuit 7 and the received signal train V(X) from the receiving circuit 6 are selected in response to the output of the counter 10, any configuration may be used in which EX-OR processing of the received signal train V(X) and the 11-bit syndrome $S_f(X)$ is performed if the number of "1"s in the syndrome $S_f(X)$ is one or zero.

Although in the above described embodiment, description was made on the BCH error correcting code employing the generator polynominal $G(X) = X^{11} + X^9$ $+X^7+X^6+X^5+X+1$, the present invention is not limited to such a generator polynominal which cannot be factored. More specifically, the present invention is widely applicable to error judgement of a received signal train in which the number m of information bits is equal to or less than the degree l of the generator polynominal.

Additionally, although in the above described embodiment, particular 5 bits in each syndrome was employed as the address of the ROM 13, the address is not limited to the above described 5 bits. Arbitrary bits in the syndrome can be employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An error correcting code decoding apparatus comprising:
   means for receiving a first digital signal train V(X) of (l +m) bits (l, m:positive integer) including an error correcting code of l bits calculated on the basis of a generator polynominal G(X) of degree l added to information bit of m bits, m being equal to or less than l,
   means for producing a second digital signal train $V_I(X) = V(1/X) \cdot X^{(l+m)} - 1$ obtained by reversing an arrangement order from the most significant bit to the least significant bit in the first digital signal train V(X) received by said receiving means so that the least significant bit in V(X) is positioned in the most significant bit in $V_I(X)$, . . . , and the most significant bit in V(X) is positioned in the least significant bit in $V_I(X)$,
   syndrome calculating means for dividing said second digital signal train $V_I(X)$ by an inverse generator polynominal $G_I(X) + G(1/X) \cdot X^l$ of said generator polynominal G(X) to obtain a syndrome $S_I(X)$ of l bits, being the remainder term,
   counter means for detecting the number of "1"s in said l-bit syndrome $S_I(X)$ obtained by said syndrome calculating means,
   means for applying an exclusive OR operation to l bits of most significant bits in the first digital signal train V(X) received by said receiving means with said l-bit syndrome $S_I(X)$ obtained by said syndrome calculating means,
   means for selecting an output of said exclusive OR means if it is determined by said counter means that the number of "1"s in said l-bit syndrome $S_I(X)$ is one or zero while directly selecting the first digital signal train V(X) received by said receiving means if it is determined that the number is two or more,
   data calculating means for calculating second data of remaining y =(l−x) bits (x:positive integer) corresponding to first data of arbitrary x bits in said l-bit syndrome $S_I(X)$ previously calculated in occurrence of a single-bit error of said first digital signal train V(X) on the basis of said first data of x bits in said l-bit syndrome $S_I(X)$ obtained by said syndrome calculating means,
   means for judging coincidence of the second data of y =(l−x) bits obtained by said data calculating means and third date of y =(l−x) bits other than said first data of x bits in the l-bit syndrome $S_I(X)$ obtained by said syndrome calculating means, and
   error judging means for judging that said first digital signal train V(X) includes a double-bit error or a multiple-bit error if an output of said counter means shows that the number of "1"s in said l-bit syndrome $S_I(X)$ is two or more and said coincidence judging means judges that said second data is not in coincidence with said third data.

2. An error correcting code decoding apparatus according to claim 1, wherein
   said error judging means judges that said first digital signal train V(X) includes no error or a single-bit error at least when said coincidence judging means judges that said second data coincides with said third data.

3. An error correcting code decoding apparatus according to claim 2, wherein
   said data calculating means is a memory storing said second data of y =(l−x) bits previously calculated with respect to said first data of x bits.

4. An error correcting code decoding apparatus according to claim 3, which further comprises means for judging whether or not said first data of x bits is correct first data in occurrence of a single-bit error of said first digital signal train V(X).

5. An error correcting code decoding apparatus according to claim 1, wherein
   means for producing said signal train $V_I(X)$ is formed by parallel-connected two bidirectional registers for writing and reading in a complementary manner.

6. An error correcting code decoding apparatus according to claim 1, wherein
   said syndrome calculating means is formed by series-connected l-stage shift registers.

7. An error correcting code decoding apparatus according to claim 1, wherein
   said error correcting code is a BCH code.

8. An error correcting code decoding apparatus according to claim 7, wherein
   said generator polynominal G(X) is equal to $X^{11} +X^9 +X^7 +X^6 +X^5 +X +1$.

9. An error correcting code decoding method comprising:
   a first step of receiving a first digital signal train V(X) of (l +m ) bits (l, m:positive integer) including error correcting codes of l bits calculated on the basis of a generator polynominal G(X) of degree l added to information bits of m bits, m being equal to or less than l,
   a second step of producing a second digital signal train $V_I(X) = V(1/X) \cdot X^{(l+m)} - 1$ obtained by reversing an arrangement order from the most significant bit to the least significant bit in the received first digital signal train V(X) so that the least significant bit in V(X) is positioned in the most significant bit in $V_I(X)$, . . . , and the most significant bit in V(X) is positioned in the least significant bit in $V_I(X)$,
   a third step of dividing said second digital signal train $V_I(X)$ by an inverse generator polynominal $G_I(X) = G(1/X) \cdot X^l$ of said generator polynominal G(X) to obtain a syndrome $S_I(X)$ of l bits, being the remainder term,
   a fourth step of detecting the number of "1"s in said l-bit syndrome $S_I(X)$ obtained in said third step,
   a fifth step of applying an exclusive OR operation to l bits of most significant bits in said received first digital signal train V(X) with said l -bit syndrome $S_j(X)$ obtained in said third step, a sixth step of selecting the signal train obtained by performing an exclusive OR operation in said fifth step if it is determined in said fourth step that the number of "1"s in said l-bit syndrome $S_j(S)$ is one or zero while directly selecting said received first digital signal train V(X) if it is determined that the number is two or more, a seventh step of calculating second data of remaining $y =(1 -x)$ bits (x:positive integer) corresponding to first data of arbitrary x bits in said 1 -bit syndrome $S_j(X)$ previously calculated in occurrence of a single-bit error of said first digital signal train V(X) on the basis of said first data of x bits in said 1 -bit syndrome $S_j(X)$ obtained in said third step, an eighth step of judging coincidence of the second data of $y =(1-x)$ bits obtained in said seventh step and third data of $y =(1 -x)$ bits other than said first data of x bits in the 1 -bit syndrome $S_j(X)$ obtained in said third step, and a ninth step of judging that said first digital signal train V(X) includes a double-bit error or a multiple-bit error if a judgement is made that the number of "1"s in said l-bit syndrome $S_j(X)$ is two or more in said fourth step and a judgement is made that said second data is not in coincidence with said third data in said eighth step.

10. An error correcting code decoding method according to claim 9, which further comprises a tenth step of judging that said first digital signal train V(X) includes no error or a single-bit error at least when it is determined that said second data coincides with said third data in said eighth step 11. An error correcting code decoding method according to claim 10, which further comprises an eleventh step of judging whether or not said first data of x bits is correct first data in occurrence of a single-bit error of said first digital signal train V(X).

12. An error correcting code decoding method according to claim 9, wherein said error correcting code is a BCH code.

13. An error correcting code decoding method according to claim 12, wherein said generator polynominal G(X) is equal to $X^{11} +X^9 +X^7 +X^6 +X^5 +X +1$.

* * * * *